United States Patent
Verma

[19]

[11] Patent Number: 5,950,973
[45] Date of Patent: Sep. 14, 1999

[54] HOUSING MOUNTING SYSTEM

[75] Inventor: Shailendra Verma, Indianapolis, Ind.

[73] Assignee: Delco Electronics, Kokomo, Ind.

[21] Appl. No.: 08/845,228

[22] Filed: Apr. 21, 1997

[51] Int. Cl.[6] .................................................. A47B 96/06
[52] U.S. Cl. .................. 248/222.51; 248/221.11
[58] Field of Search .......................... 248/27.3, 220.43, 248/222.51, 231.9, 231.91, 906, 220.31, 220.41, 221.11, 222.13, 503, 222.12, 688, 690, 680; 220/480, 482, 3.3

[56] References Cited

U.S. PATENT DOCUMENTS

| | | | |
|---|---|---|---|
| 979,011 | 12/1910 | Levy | 174/50 |
| 1,211,992 | 1/1917 | Winter | 248/222.51 |
| 2,383,621 | 8/1945 | Schonitzer et al. | 220/3.8 |
| 2,449,646 | 9/1948 | Emde | 439/366 |
| 2,461,936 | 2/1949 | Stone | 248/222.51 |
| 2,506,119 | 5/1950 | Tregear | 248/222.51 |
| 2,880,262 | 3/1959 | Bell et al. | 248/27.3 |
| 3,531,070 | 9/1970 | Roddy | 248/221.11 X |
| 5,398,157 | 3/1995 | Paul | 248/221.11 X |

Primary Examiner—Ramon O. Ramirez
Assistant Examiner—Anita M. King
Attorney, Agent, or Firm—Jimmy L. Funke

[57] ABSTRACT

A mounting system for a housing and method of mounting a housing is provided where the housing is to be mounted to a slotted member in a secure and rigid fashion without loosening over time, particularly when exposed to high vibration environments. The mounting system includes a mounting arm of the housing which is to be inserted through a first slot and then pivoted so that a finger projection on the arm pivots up into a second slot formed in the frame member. The spacing of the first and second slots and the length of the arm and position of the finger projection thereon are such that when the finger is pivoted into the second slot, a cam surface on the finger will engage and slide against at least one of the walls of the slot so as to bias the arm against the frame member in the slots. In this manner, the arm is preloaded against subsequent movement even when subject to intense vibrations or other loosening forces. Other bolt fastener(s) are contemplated for use in mounting the housing by way of mounting flange(s) provided on the housing spaced from the arm or arms at predetermined positions therearound.

8 Claims, 2 Drawing Sheets

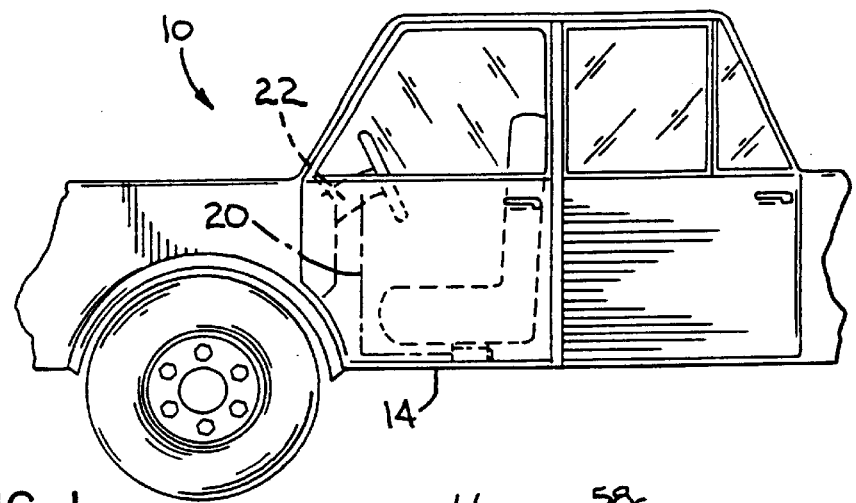
FIG. 1
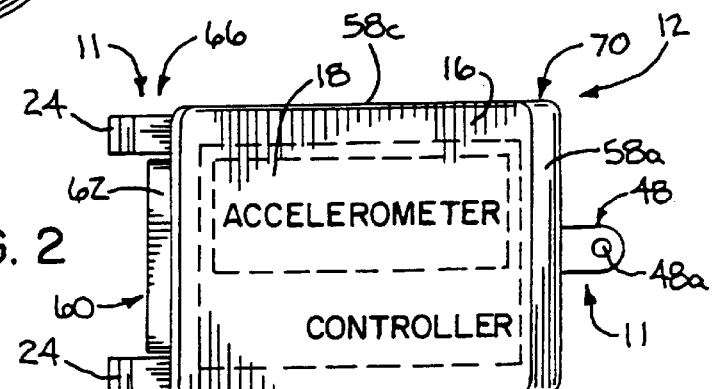
FIG. 2
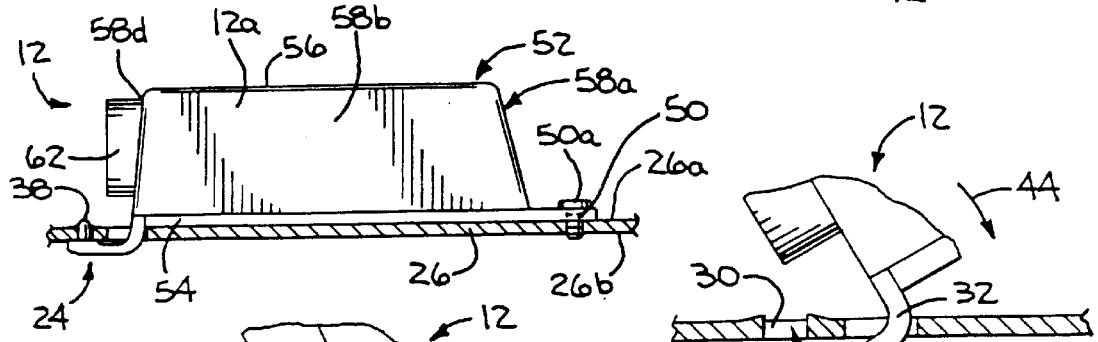
FIG. 3
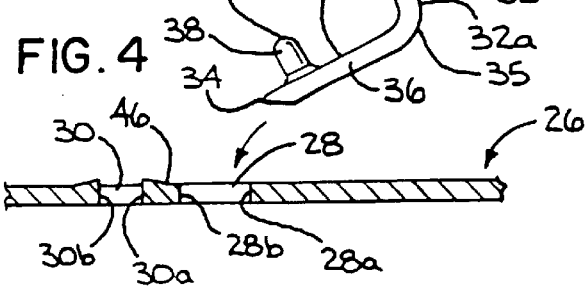
FIG. 4
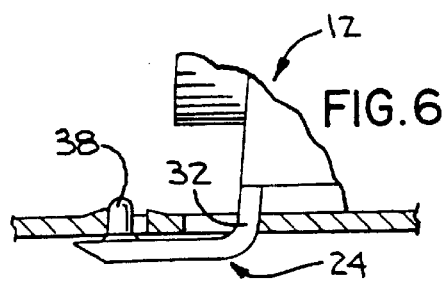
FIG. 5
FIG. 6

HOUSING MOUNTING SYSTEM

FIELD OF THE INVENTION

The invention relates to a mounting system for a housing, and more particularly, to a mounting arm of the housing which is inserted through slots in a member to which the housing is to be secured.

BACKGROUND OF THE INVENTION

There are a wide variety of fastening or mounting systems to form structural connections for joining or mounting two or more mechanical or structural components together. Of these systems, they can be generally classified as either of the temporary-type which can include the use of screw fasteners, snap fit arrangements, and clamping mechanisms, or of the permanent-type which include brazed, welded and riveted joints. The latter type of mounting systems typically require more extensive labor than the former, such as when comparing welding versus the use of a screw fasteners or snap fit arrangements. Thus, in many instances, the use of the temporary-type of mounting systems are preferred. This is particularly true in the assembly operations for automobiles where minimizing assembly time can be of paramount importance.

In the automotive field where housings can be utilized to contain sensitive electrical components for mounting them in the vehicle, such as controllers having sensors for activating various safety devices (e.g., airbags) in the automobile once a predetermined crash condition is sensed, secure and rigid mounting of the housing to the vehicle frame or chassis is critical. In view of the earlier-mentioned need for fast assembly time, the mounting systems for controller housings in automobiles have focused on the temporary-type of mounting previously described, in particular of the bolt or screw fastener type. This additionally provides the advantage of disassembly to allow for servicing or replacing of components contained within the housing when necessary. In particular, housings for airbag controllers are typically mounted utilizing only a bolted attachment between the housing and the vehicle chassis, such as to the floor under the auto mobile seat. Such bolted mounting systems utilize up to six bolts to obtain the desired rigidity and strength in the mounting of the housing to the chassis.

The use of large numbers of bolt or screw fasteners to attach or mount the housing to the frame of the car increases costs for producing and installing the housing into an automobile. With mounting systems requiring large numbers of tightly torqued bolts to properly mount the housing, more parts must be produced and the housing must be provided with portions having clearance holes for receiving the fastener therethrough which, depending on the number of fasteners utilized, can undesirably increase the size of the housing. In addition, the time required for inserting and torquing the bolts to mount the housing to the vehicle chassis goes up with each additional bolt utilized. Another consideration for an assembly exclusively employing bolts is that the strength of the mounting depends to a great extent on the initial loading and stress placed on the bolt by the assembly torque. Thus, where safety concerns are paramount, very small bolts or screws are dangerous to use because it is easy to overload the bolt or screw in assembly and actually twist it off. Thus, larger bolts which can take greater assembly torque loads would be desirable; however, larger bolts necessarily and undesirably increase the size of the bolted-only mounting systems. Accordingly, there is a need for a mounting system for housings which reduces the number of parts needed for assembly and also reduces the assembly time required for mounting the housing to the vehicle frame. Specifically, a mounting system which does not rely so heavily on bolted connections would be preferred so as to be able to reduce the number of bolts employed in the system.

In a effort to address the above needs of automobile manufacturers as to reducing parts and assembly time, it has been proposed to use snap fit arrangements in conjunction with bolts to lower their number. Snap fits typically will include an extension part on the housing which is pushed into a tight fitting opening in the vehicle chassis so that the extension deforms as it is inserted and rebounds or snaps back to its original undeformed configuration once cleared through the frame opening so as to provide a snap fit between the two. With snap fit arrangements, it has been found that the housing will tend to rattle, particularly after prolonged exposure to the high vibration environment encountered when used in automobiles. Any rattling is not acceptable in the automobile industry, especially where the housing is to be used to mount electronic components to the vehicle chassis, such as the above-described airbag controller. Rapid vibration or rattling of the housing when used to contain a controller can cause serious problems in the electronic equipment utilized and lead to malfunctions of any operating systems they may control. In addition, automobile manufacturers do not want high insertion forces for assembly purposes, such as would be necessary in a design of a snap fit arrangement that would provide sufficient strength and rigidity for securely mounting the housing to the vehicle chassis without shifting or rattling relative thereto. Thus, there is a need for a mounting system for a housing such as that for vehicle electronic components, e.g., airbag controllers, which secures the housing to the vehicle chassis without producing looseness or rattling of the housing even after prolonged exposure to high vibration environments and which has low insertion forces for ease of assembly thereof. In addition and as previously discussed, such a mounting system should utilize a minimum number of parts to lower manufacturing and assembly costs for the housing mounting system.

SUMMARY OF THE INVENTION

In accordance with the present invention, a mounting system including a mounting arm for a housing and method for mounting the housing including the mounting arm to a slotted member such as a frame member or chassis of a passenger vehicle, is provided.

The present mounting system including the mounting arm on the housing provides a strong and rigid mounting of the housing to the frame member so as to resist shifting of the housing relative thereto, even under intense vibration conditions such as can be found in automotive applications. It is contemplated that the mounting arm herein will be used in conjunction with bolts or other fasteners; however, the secure mounting achieved with the mounting arm is beneficial in terms of reducing the number of bolt fasteners required to securely mount the housing. Thus, the present mounting system securely mounts the housing to the frame member in a simple manner with the mounting system herein resisting any rattling and shifting of the housing such as could be caused by use in high vibration environments. The mounting system utilizes a minimum number of bolt fasteners to achieve a strong connection between the housing and frame member. Accordingly, the costs for manufacturing the mounting system is lowered as less bolts need be provided, and assembly time is reduced as less bolts need to be installed and tightened. In addition, ease of assembly is improved as the arm is simply slid into slots provided in the frame member with very low insertion forces as will be more particularly described herein.

The present mounting system includes the above-mentioned mounting arm of the housing for inserting into slots formed through a vehicle frame. The mounting arm includes a proximate portion for inserting through a first slot in the frame with a pivotal insertion of the mounting arm through the first slot. An intermediate portion is disposed beneath the frame to engage the frame lower surface when the mounting arm is pivoted to bring the housing against the upper side of the frame to resist movement of the housing away from the frame. A distal portion is connected to the intermediate portion and projects into a second slot of the frame to engage walls of the slot to resist shifting of the housing in a plane parallel to the frame and to resist shifting away from the frame. As previously mentioned, the mounting arm of the present invention is effective to securely mount the housing to the vehicle frame with a strong connection therebetween so that the housing does not slide relative to the frame or move away from the frame even when subject to the high vibrations that can occur during operation of an automobile.

In a preferred form, the arm distal portion is spaced along the arm at a first predetermined distance from the housing. The mounting arm has a relaxed state where the arm distal portion is at the first predetermined distance from the housing before the arm is inserted through the frame slots. The arm has a stressed state with the arm distal portion engaging walls in the second frame slot and being at a second predetermined distance from the housing less than the first predetermined distance to fix the arm relative to the frame for securing the housing to the vehicle frame. Thus, with the mounting arm inserted through the slots and frictionally engaging the walls of the slots, the mounting arm will be stressed and preloaded to resist any movement or shifting of the housing relative to the frame such as by sliding of the housing on the frame or pivoting of the housing off of the frame.

In one form, the housing has a lower periphery and a portion for receiving a fastener to attach the housing to the frame upon securing of the fastener to the vehicle frame. The housing fastener-receiving portion and the mounting arm are spaced from each other at predetermined positions around the body lower periphery such that the housing is held strongly fixed against the frame and against sliding movement relative thereto. In addition, with the mounting arm herein, the number of fastener-receiving portions and corresponding fasteners therefor can be reduced to reduce the size of the housing and the number of parts required for mounting the present housing over prior housings using bolted-only assemblies for their mounting system.

The housing and mounting arm can be formed of a substantially non-creep material. The housing including the mounting arm thereof may be formed of a die-cast aluminum material. The use of non-creep, die-cast aluminum provides the present housing with high tensile or yield strength and good resistance to shock loads, while still keeping the housing at a relatively light weight which is of particular value in automotive applications.

The provision of the mounting arm on the housing can take place at any number of locations thereon. Herein, several preferred locations around the housing for the mounting arm are indicated.

In one form, the housing includes a top cover having a top wall and sidewalls depending from the top wall with the sidewalls having a bottom distal from the top wall. The housing further includes a base wall attached to the bottom of the sidewalls to close an interior space of the housing wherein the base wall includes an outer periphery. The mounting arm is integral with one of the periphery of the base wall and the bottom of at least one of the sidewalls. In another form, the housing has a generally rectangular shape in horizontal cross-section so that it has four sides forming four corners around the periphery of the housing and the housing includes at least one apertured flange at one corner of the housing with the mounting arm being at an opposite non-adjacent corner of the housing. In another form, the housing is generally rectangular and includes a flange intermediate a pair of adjacent corners of the housing along one side of the housing and the mounting arm includes a pair of mounting arms at the other pair of adjacent corners of the housing along another side of the housing opposite the one side of the housing. In yet another form, the housing is rectangular and includes a pair of apertured flanges at non-adjacent corners of the housing and the mounting arm is at another corner of the housing adjacent each of the non-adjacent corners. As will be appreciated, the number and location of mounting arms and fastener flanges can be varied to achieve the necessary or desired rigidity in the mounting of the housing to the frame member without departing from the invention herein. It will be manifest that in certain instances a greater number of arms and flanges may be required for approval by the automotive manufacturer; in other cases, a lower number of arms and flanges can be utilized while still meeting the design and safety criteria established by the manufacturer. In any event, it will be apparent that the number and location of arms and flanges can be varied from that set forth herein to meet specific customer requirements.

The mounting arm is preferably provided on a housing which contains a controller having an accelerometer for sensing vehicle crash conditions and to control operation of an airbag in the vehicle when the crash condition is sensed wherein the controller is contained within the housing for mounting to the vehicle frame. As previously mentioned, a secure and stable mounting of a housing for a vehicle airbag controller can be critical. The present invention including the mounting arm provided on the housing is effective to secure the housing to the vehicle frame against shifting relative thereto while also lowering assembly time, part cost, and allowing for a reduction in size of the housing herein.

In another form of the invention, a vehicle has a frame to which the controller is mounted contained in a housing body having an interior for housing the controller. A mounting arm of the body extends outwardly therefrom and has a finger projection at the distal end thereof. First and second spaced arm receiving openings are formed in the vehicle frame for mounting the body to the frame with the spacing between the openings being sized so that with the arm inserted through the first opening and the distal end of the arm adjacent the second opening with the finger projecting therein, the arm will be biased against the frame in the openings thereof to preload the arm with the arm being substantially locked in position relative to the openings for securing the housing body to the vehicle frame against movement relative thereto.

Utilizing the mounting arm and slots in the vehicle frame provides for secure mounting of the housing to the frame without requiring the high number of fasteners as in the previous fastener-only mounting system. In addition, the present mounting system requires very low insertion forces as the arm is inserted through the first frame slot and the housing is pivoted down towards the frame with the arm acting as a lever to insert the finger into the second frame slot for locking the arm preloaded in the slots. As discussed earlier, the mounting arm lessens the number of fastener-receiving flanges required to be formed around the housing, and the frame slots can be simply formed in the frame such as by a metal stamping or punching mechanism so that the present invention provides for simpler manufacturing over prior mounting systems which require increased numbers of fasteners, fastener-receiving portions formed around the housing, and corresponding clearance holes and nuts welded to the frame. It should be recognized that the mounting system utilizing the mounting arm herein can be supplemented with other additional snap-fit type fastener arrangements or, as contemplated hereon, bolt fasteners; however, it is possible to reduce the number of such additional types of fasteners with the present invention.

In one form, the finger projection can include a cam surface which cams against the frame as the finger projection is inserted into the second opening. In this manner, the insertion of the arms through the frame slots to mount the housing to the frame is facilitated without requiring the high insertion forces such as may be found in snap fit arrangements.

In one form, the housing body includes an apertured flange for receiving a fastening member therethrough to fasten the body to the vehicle frame so that with the fastening member tightened in the apertured flange and the arm in its preloaded locked position, the housing body is secured against movement relative to the frame. As previously mentioned, the number of apertured flanges formed with the housing herein can vary depending on the rigidity of the mounting deemed necessary for a particular application and customer requirements. It is anticipated for automotive applications that a single mounting arm with one or two apertured flanges should be sufficient although it will recognized that the housing will oftentimes be over-designed to satisfy the safety concerns ever present in the automotive industry, particularly where the housing is utilized to contain an airbag controller.

In another form of the invention, a mounting arm for a housing which is to be secured onto a surface of a slotted member is provided. The mounting arm includes a proximate spacer portion at its proximate end which extends down from the housing through the proximate slot of the member to allow the bottom of the housing to seat flush on the slotted member surface when pivoted thereon. A substantially flat portion of the mounting arm extends out from the bottom of the spacer portion to the mounting arm distal end with the flat portion being below the slotted member when the housing is seated on the member surface. A distal member engaging portion on the intermediate portion extends transversely to the intermediate portion for being tightly received in a distal slot of the slotted member with the spacer portion extending through the proximate slot and the intermediate section extending below the member between the slots thereof for securing the housing onto the member surface. The pivotal mounting of the housing provides the present mounting system with very low insertion forces for assembly of the housing to the slotted member, e.g., vehicle frame.

In one form, the distance between the proximate spacer portion and the distal member engaging portion relative to the distance between the proximate and distal slots can be such that with the spacer portion in the proximate slot and the distal member engaging portion in the corresponding distal slot, the mounting arm is biased against the member in the slots thereof so as to be fixed against movement relative to the slotted member. The member engaging portion and the spacer portion can each include an arcuate surface for camming the member engaging portion into the distal slot with the spacer portion being against the member in the proximate slot by pivoting the housing down towards the member surface until the housing is seated flush on the slotted member surface. In this manner and as previously discussed the intermediate portion acts as a lever arm as the housing is pivoted down so as to reduce the insertion force required to load the arm as the distal portion cams into the distal slot.

The mounting arm can be provided in combination with an apertured flange of the housing so that with the mounting arm received in the slots of the slotted member and a fastener tightened in the apertured flange, the housing is strongly and stably secured against movement relative to the slotted member even when used in high vibration environments.

In another aspect of the invention, a low insertion force method for mounting a housing for a control device to a slotted member is provided. The method includes providing a mounting arm on the housing extending outwardly therefrom with the mounting arm having first and second member engaging portions, inserting the mounting arm through a first slot in the member, positioning the second member engaging portion below a second slot in the member spaced from the first slot with the first member engaging portion in the first slot, pivoting the housing towards the slotted member with the arm first portion engaging in the first slot and the arm second portion engaging and sliding in the second slot, and biasing the mounting arm by continuing the pivoting until the housing is flush against the slotted member with the first portion extending in the first slot and the second portion extending in the second slot.

The second member engaging portion can be positioned below the second slot in the body member by pivoting of the first member engaging portion in the first slot.

The mounting arm first and second portions can be spaced relative to the spacing of the first and second slots so that pivoting the housing and biasing the mounting arm stresses and loads the arm to keep the arm fixed relative to the slotted member.

The mounting arm first and second portions can be provided with arcuate surfaces. Pivoting the housing cams the surfaces of the first portion and the second portion against the member in the respective first and second slots thereof.

BRIEF DESCRIPTION OF THE DRAWINGS

FIG. 1 is an elevational view of the passenger compartment portion of an automobile showing in ghost a housing for an airbag controller mounted to the vehicle chassis below the car seat;

FIG. 2 is a plan view of the housing having a mounting system including a pair of mounting arms thereof and an apertured fastener-receiving flange for mounting the housing to the vehicle chassis in accordance with one form of the present invention and showing in ghost the housing containing an airbag controller having an accelerometer that senses predetermined vehicle accelerations for signalling and actuating the automobile airbag device;

FIG. 3 is a side elevational view of the housing of FIG. 2 secured to the vehicle frame by the mounting arms and a fastener extending through the aperture flange of the housing;

FIG. 4 is a side elevational view showing the mounting arm of the housing pivoted up before insertion through first and second slots formed in the vehicle frame;

FIG. 5 is a side elevational view showing the arm inserted through the first slot to position a projection finger thereon for insertion into the second slot;

FIG. 6 is a side elevational view showing the arm extended through both first and second slots of the frame for mounting the housing thereto;

DETAILED DESCRIPTION OF THE PREFERRED EMBODIMENT

Figure 7:
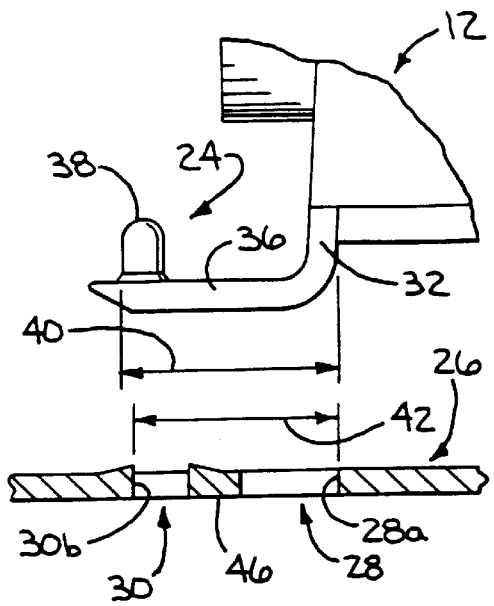
FIG. 7 is a side elevational view of the mounting arm and the slots showing the relative spacing between the finger projection portion and spacer portion of the mounting arm and the first and second slots for preloading the arm when inserted therein.

FIG. 1 illustrates passenger vehicle in the form of an automobile 10 in which the present invention can be utilized. The invention relates to a mounting system, generally designated with the reference numeral 11 in FIG. 2, for a housing 12 which can be mounted in the passenger vehicle 10, although it will be recognized that the mounting system 11 for the housing 12 herein can be utilized in a wide variety of environments besides that of a passenger vehicle. The mounting system 11 for the housing 12 herein is an improvement over prior bolted-only mounting arrangements where up to six (6) bolts had to be utilized to properly fasten the housing 12 to the floor or chassis frame 14 of the vehicle 10.

As the housing 12 can be utilized to contain sensitive electronic components utilized for controlling operating systems of the vehicle 10, such as an airbag controller 16 having an accelerometer 18 thereon (FIG. 2), a secure and stable mounting of the housing 12 is necessary. The mounting of the housing should be of sufficient strength that the housing 12 remains rigidly connected to the frame 14 even when subject to harsh operating conditions such as the high vibration environment or other loosening forces often encountered when operating automobiles 10. In other words, because the housing 12 can contain an airbag controller 16 for sensing vehicle crash conditions, it is important that there be no looseness or rattling in the mounting of the housing 12 that could adversely effect the sensing function of the airbag controller 16 including the accelerometer 18 thereof. The controller 16 sends signals along signal transmission line 20 once the vehicle crash condition is sensed by the accelerometer 18, which can actuate a pyrotechnic device of the airbag mounted in the steering assembly 22 of the passenger vehicle 10. Accordingly, any undesirable strains or even microstrains of the accelerometer are to be avoided. Thus, if the housing 12 becomes loose or the mounting thereof fails in any way, it is possible that the controller 16 may not properly signal the airbag for proper deployment when crash conditions exist. As is apparent, the mounting of the housing 12 therefore can take on critical importance.

As discussed earlier, the prior bolted-only type mounting of controller housings utilized a relatively large number of bolts requiring the housing to be provided with a number of bolt-receiving sites therearound which increased the expense associated with the manufacture of the housing and also increased the number of parts required for mounting the housing in the automobile 10. Smaller housings are desirable due to the space constraints that are present in many vehicles. Similarly, the trend is towards smaller and lighter parts for most new passenger vehicles 10 to reduce the overall vehicle weight. Accordingly, the present mounting system 11 for the housing 12 herein is effective to reduce the number of screw or bolt fasteners required for securing the housing 12 to the vehicle floor 14, thus reducing the number of parts required for mounting of the housing 12 which also reduces the time required to screw the housing 12 to the vehicle floor 14. By requiring fewer bolt fasteners, the present mounting system 11 is effective to lower the overall part cost to the manufacturer. Moreover, with less bolts, less bolt-receiving sites need be provided for the housing which translates to a smaller size of the housing 12.

The mounting system 11 herein utilizes mounting arm 24 for insertion through a slotted member 26, which in the vehicular application described above can be part of the vehicle floor or chassis 14. The slotted member 26 can include an upper surface 26a and a lower surface 26b thereof through which a pair slot openings 28 and 30 are formed, such as by a metal stamping or punching mechanism. The slots 28 and 30 are bounded by pairs of parallel vertical walls 28a and 28b and 30a and 30b, respectively, which extend between the member upper and lower surfaces 26a and 26b. When the mounting arm 24 is pivoted into the slots 28 and 30, such as shown in FIG. 6 and as will be described hereinafter, the housing 12 is seated flush on the member upper surface 26a against shifting relative thereto.

Turning to the preferred and illustrated construction for the present mounting arm 24, a proximate or spacer portion 32 of the arm 24 is provided with the proximate spacer portion 32 inserted into the first slot 28 in the frame or slotted member 26 when the housing 12 is mounted to the frame member 26. The mounting arm 24 further includes a substantially flat or intermediate portion 36 which extends from the leading end 34 of the arm 24 to the bottom of the spacer portion 32 at the trailing end 35 of the arm 24. After the leading end 34 is inserted through the first slot 28 along with the flat intermediate portion 36, the spacer portion 32 will extend in the slot 28, as shown in FIG. 5. A distal portion or finger projection 38 is provided on the arm intermediate portion 36 adjacent the leading end 34 thereof for being inserted into the frame second slot 30. Herein, the terms proximate and distal for the components of the mounting system 11 generally refer to the orientation relative to the housing 12 and how the arm 24 is inserted through the slots 28 and 30 with the arm leading end 34 being distal as it is initially inserted and the arm trailing end 35 being proximate as it is lastly inserted. Similarly, the slots 28 and 30 and their corresponding walls 28a and 28b and 30a and 30b, respectively are termed proximate and distal based on their orientation relative to the mounted housing 12 and the corresponding portions on the arm 24 once it is inserted through the slots 28 and 30.

To assemble the housing 12 to the frame member 26, the housing 12 including the mounting arm 24 thereof is pivoted up relative to the frame member 26, such as shown in FIG. 4, to orient the arm 24 for insertion through the first or proximate slot 28. The slot walls 28a and 28b are spaced sufficiently from each other to provide the slot 28 with enough clearance to receive the largest part of the arm 24 therethrough. Thus, slot 28 is wide enough to clear the arm leading end 34, which includes the height of the finger projection 38 above the top of the arm, through the slot 28 when the arm 24 is pivoted up a sufficient amount relative to the member 26. As best seen in FIGS. 4 and 7, the width of the slot 28 or spacing between walls 28a and 28b thereof is greater than the width of slot 30 or spacing between walls 30a and 30b thereof.

After inserting the mounting arm 24 including the finger 38 thereof through the slot 28, the arm flat portion 36 can be fully inserted through the slot 28 so that the arm spacer portion 32 is extending in the slot 28, as shown in FIG. 5. The arm portion 32 extends downwardly from the housing 12 and curves at the bottom thereof where the flat intermediate arm portion 36 begins and extends to the arm leading end 34, as described earlier. The arm portion 32 extends down from the housing 12 a distance sufficient so that with the bottom of the housing 12 seated flush on the member surface 26a, the intermediate arm portion 36 is spaced from the bottom of the housing body 12a at a distance slightly greater than the thickness of the member 26 between the parallel top and bottom surfaces 26a and 26b thereof. In this manner, when the arm 24 is finally installed in the slots 28 and 30, as will be described hereinafter, the bottom of the housing 12 will be seated flush on the member surface 26a with the top 36a of the portion 36 being closely adjacent to and/or abutting the bottom 26b of the member, as best seen in FIG. 6.

With the arm spacer portion 32 extending in slot 28, the spacing of the slots 28 and 30 and the finger projection 38 along the length of the arm 24 will be such that the projection 38 can be positioned for insertion into the second slot 30 by engaging the arm spacer portion 32, and particularly the outer arcuate surface 32a thereof with the proximate wall 28a of the frame slot 28 and pivoting it thereagainst by pushing and pivoting the housing 12 down in a clockwise direction towards the top surface 26a of the frame member 26 so as to cause the finger projection 38 to pivot clockwise up until it is substantially adjacent to and below the frame slot 30 for being inserted therein. Once the cam surface 38a on top of the finger 38 starts to engage the bottom of the slot wall 30b and cam thereagainst by continuing the pivoting of the housing 12 down towards the member 26, there will be a portion of the finger 38 that will want to travel beyond the slot distal wall 30b as it is pivoted to come up and under the frame member lower surface 26b adjacent the distal wall 30b so as to provide interference to continued insertion of the finger 38 into slot 30.

To continue the installation process of inserting the finger projection 38 into the slot 30, the pushing action on the housing 12 down towards the member surface 26a proceeds in a clockwise pivoting direction with increased resistance due to the interference and camming frictional engagement between surfaces 38a and 30b; however, the insertion forces required for the mounting arm 24 herein will be significantly lower than for a snap fit arrangement designed to provide a comparable type of secure and durable mounting as the cantilevering out of the finger 38 from the housing 12 along the length of the arm intermediate portion 36 furnishes a lever arm about the engaging cam surface 32a of the arm proximate portion 32 and the proximate slot wall 28a for the camming action occurring between the cam surfaces 38a and 30b. In this manner, the mounting arm 24 herein provides a mechanical advantage for cammingly inserting the finger 38 into slot 30 during pivoting of the housing 12 down onto the surface 26a. Thus, as the housing 12 is pivoted clockwise down about the pivot point afforded by the engagement between curved surface 32a and flat vertical wall 28a, the distal finger 38 will likewise pivot clockwise into slot 30 with camming of arcuate cam surface 38a against flat vertical wall 30b until tightly and fully received in the slot 30, as shown in FIG. 6.

As set forth above, as the finger 38 is cammed into slot 30, the frictional resistance will increase due to the interference provided by the sizing of arm 28 and particularly the position of the finger projection 38 thereon relative to the spacing of the slots 28 and 30. As previously described, when the finger 38 is positioned for insertion into slot 30, there will be interference from the member 26. Referring to FIG. 7, the arm distal finger 38 is positioned out from the housing 12 at a first predetermined distance therefrom when the arm 28 is in its relaxed, non-stressed state before mounting of the housing 12 to the frame member 26. However, when the arm 28 is stressed and preloaded with the proximate portion 32 thereof in slot 28 and the distal finger portion 38 thereof in slot 30 as seen in FIG. 6, preferably the finger 38 will be positioned at a second predetermined distance from the housing 12 that is less than the first predetermined distance. In other words, the distance 40 between the spacer portion 32 and distal finger 38 is greater than the distance 42 between proximate wall 28a of slot 28 and distal wall 30b of slot 30, as depicted in FIG. 7, to provide the desired amount of interference to insertion of the finger 38 in slot 30, and thus loading of the arm 24 when inserted in the frame slots 28 and 30.

Therefore, when the housing 12 Is pivoted clockwise to its flush mounted position on member surface 26a in the direction of arrow 44, the cam surface 38a of the finger 38 and the slot wall 30b engage one another to allow at least one of the engaged slot wall 30b and the finger 38 and at least one of the engaged slot wall 28a and the spacer 32 to slightly deform or move from their original position and configuration, such as in a direction transverse to the pivoting direction 44 of movement between the housing 12 and member 26, to internally pre-stress the arm 24 and frame member 26 against each other in the slots 28 and 30. It is preferred that it is the arm 24 that is deformed so that as the finger 38 is cammed into the slot 30, the slot walls 28a and 30b will exert compressive forces on their respective engaged arm portions 32a and 38a to cause one or both of the spacer 32 and finger 38 to move towards the other with the arm intermediate portion 36 slightly flexing to accommodate the above movement. In this manner, the arm 24, and particularly the proximate spacer portion 32 and distal finger projection 38 thereof, will be biased against the slot walls 28a and 30b, respectively, so that the arm 24 is biased out and preloaded against the frame member 26 in the slot openings 28 and 30 thereof.

In this stressed state, there will be a high amount of frictional resistance to relative movement between engaging surfaces on the finger 38 and slot wall 38b and the spacer 32 and slot wall 28a so as to substantially lock the arm 24 in place relative to the slots 28 and 30. With the arm 24 extending in slots 28 and 30 as described above, the housing body 12a will be secured against shifting in a plane parallel to the frame member 26 by the engagement and biasing of the arm 24 in the slots 28 and 30 and to pivoting away from the frame 26 by the high frictional forces between the arm 24 and frame 26 engaging surfaces. The arrangement of the substantially flat intermediate portion 36 adjacent to the frame member intermediate portion 46 extending between the slots 28 and 30 also prevents the housing 12 from movement away from the frame member 26.

The resistance encountered during assembly of the housing 12 to the member 26 will be dictated by the interference provided by the relative sizing of distances 40 and 42, the cantilever of the finger 38 out from the housing 12, and the materials used for the member 26 and arm 24. In automotive applications where the housing 12 is for containing sensitive electrical components, such as the previously described airbag controller, the housing 12 including the arm 24 thereof are preferably formed of a non-creep material such as an aluminum alloy that will impart the desired structural characteristics and integrity to the housing, e.g., high tensile and yield strengths with good resistance to shock loads. Because there is no creep, i.e., plastic flow under constant stress, when the arm 24 is being constantly stressed when preloaded in slots 28 and 30, the arm 24 will not tend to fatigue and lose its internal resiliency so that the loading on the arm 24 in the slots 28 and 30 will be sustained and remain constant over time. In addition, the use of aluminum is favorable for weight considerations important with automotive parts. The aluminum housing 12 is preferably die cast to provide for improved manufacturing due to the relatively large surface area of the housing 12 in comparison to its low weight. A high strength polymer material for the housing 12 could also be used.

Normally, automotive frames 14 are composites of heavy steel stampings which include various side rails, cross members and mounting brackets assembled into a foundation for the major vehicle components and bodies of passenger vehicles 10. Thus, where the housing 12 is of aluminum and for use with a steel vehicle frame member 26, the cantilever out of the finger 38 along the arm 24 and the interference between the finger 38 and slot 30 are such that the insertion forces are kept to a minimum while still providing the arm 24 with sufficient frictional engagement in slots 28 and 30 so as to securely mount the housing 12 to the frame member 26 without movement or shifting relative thereto. As is apparent, when utilizing an aluminum housing 12 and steel frame member 26, it is the aluminum arm 24 that will tend to bow as the finger 38 is inserted in the slot 30.

In addition to the above-described mounting arm 24, the preferred housing body 12a will have additional fastening means such as a mounting foot portion or flange 48 thereof having a fastener-receiving aperture 48a formed therethrough to receive a screw or bolt fastener 50 therein, as shown in FIGS. 2 and 3. The flange 48 and corresponding bolt fastener 50 are similar to that used in the prior bolted-only mounting systems; however, the number thereof can be substantially reduced due to the provision of the mounting arm(s) 24. In particular and as previously mentioned, prior mounting systems typically utilized up to six (6) bolts for securing the housing 12 against movement relative to the frame member 26 which created a relatively large housing requiring more parts and greater assembly time versus the housing 12 herein. By contrast, the present housing body 12 can be used with a substantially reduced number of bolt fasteners 50 such as the single flange housings 12 and 12' shown in the embodiments of FIGS. 2 and 8, or the double flange housing 12" shown in the embodiment of FIG. 9. The present aluminum housing 12 used to contain the airbag controller 16 is smaller than the prior bolted-only housing previously described due in part to the lesser number of fastener-receiving sites or flanges 48 around the bottom periphery of the housing body 12a. As an example, the housing 12 can have a substantially rectangular or square form in horizontal cross-section and can have horizontal cross-sectional dimensions of approximately 3"×3" with a height of approximately 1½".

Thus, to secure the housing 12 against the frame member 26, the arm 24 is pivoted into its locked position in the slots 28 and 30 as previously described and a bolt fastener 50 is inserted through the flange aperture 48a and an aligned clearance hole in the frame member 26 to clamp the flange 48 between the bolt head 50a and member surface 26a. The torquing of the bolt 50 will create a clamping force on the flange 48 so that the clamping force in conjunction with the locking of the arm 24 in the slots 28 and 30 will resist any movement or shifting of the housing 12 such as laterally in a plane parallel to the member 26 or away from the member 26, such as by counter clockwise pivoting of the housing 12, to fix the housing 12 relative to the member 26.

Turning now to the details of construction of the various embodiments of the housing 12, it can be seen that the housing 12 preferably is formed having a top cover member 52 and a base wall member 54. The top cover 52 has a top wall 56 extending in a plane substantially parallel to the base wall member 54. Four peripheral walls 58a–58d depend from the outer peripheral edge 56a of the top wall down to the bottom of the top cover member 52 distal from its top wall 56 to the base member 54 so as to provide the housing 12 with a constant height therearound. The top wall 56 can have a square shape as in the housing 12 depicted in FIGS. 2 and 3 and the housing 12" of FIG. 9, or a substantially rectangular shape as in the housing 12' of FIG. 8 while the base wall 54 will preferably have a rectangular shape. It will be understood that a wide variety of other different shapes can also be utilized within the purview of the present invention. Where the top wall 56 is square as with housings 12 and 12", one of the walls, preferably end wall 58a, will depend from the top wall 56 at an incline therefrom. The sidewalls 58b and 58c can be equal in length and end walls 58a and 58d can be equal in length but shorter than the sidewalls 58b and 58c.

At the bottom of the walls 58a–58d, the base member 54 is secured to the top cover member 52, such as by screw fasteners (not shown.) or by any other suitable attachment means. The base member wall 54 also has an outer peripheral edge portion 54a that can be vertically aligned with the peripheral edge portion 56a of the cover member top wall 56 such as in the housing 12 of FIGS. 2 and 3 and the housing 12" of FIG. 9, or the peripheral edge 54a can extend beyond the peripheral edge 56a of the cover member top wall 56 to form a shoulder 60a around the bottom of the housing 12 such as in the housing 12' of FIG. 8.

A window 60 can be formed in one of the walls, preferably end wall 58d opposite end wall 58a with the window 60 being bounded wall portions 62 which can extend out at right angles from the wall 58d in which the window 60 is formed. The window 60 allows the controller 16 to be electrically attached to conductor line 20 extending exteriorly of the housing 12 by way of electrical conductor pins 64 which project in the window 60 and are shielded by the wall portions 62 thereof. The pins 64 can be plugged into a socket (not shown) provided on the end of conductor line 20 to electrically attach the controller 16 to the line 20. In the housings having a tapered or inclined end wall 58a, the window 60 can be formed in the opposite straight or vertical end wall 58d as can be seen in the housing 12 of FIGS. 2 and 3 and the housing 12" of FIG. 9.

As previously mentioned, the mounting arm(s) 24 and the fastener flange(s) 48 are preferably provided at the lower periphery of the housing body 12a at predetermined positions therearound. It is possible to form the arms 24 and flanges 48 integrally with either the bottom of the walls 58 or the base wall member 54. Referring to the housing 12 of FIGS. 2 and 3, a pair of mounting arms 24 are formed at adjacent corner regions 66 and 68 formed by the juncture of sidewall 58c with end wall 58d and the juncture of sidewall 58b with the other side of the end wall 58d, respectively. The arms 24 are thus provided on either side of the window 60 of the housing 12. As can be seen in FIG. 2, the arms 24 extend down and outwardly from the housing 12 substantially perpendicular to the lower edge of the housing body 12a at the bottom of the end wall 58d so that their projections 38 extend laterally out from and substantially parallel to end wall 58d. A single mounting flange 48 is provided at the bottom to periphery of the housing body 12a intermediate adjacent corner regions 70 and 72 formed by the juncture of sidewall 58c and end wall 58a and the juncture of sidewall 58b and the other side of end wall 58a, respectively. The flange 48 projects outwardly from the housing body 12a in a direction opposite to the mounting is arms 24 of the housing 12 substantially perpendicular to and level with the lower edge of the housing body 12a at the bottom of end wall 58a.

Figure 8:
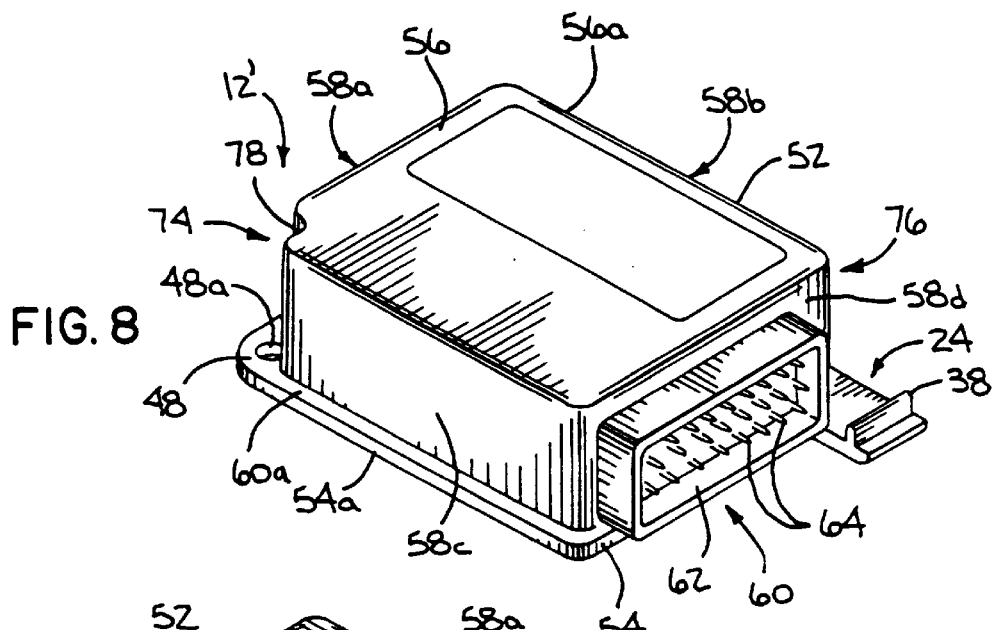
FIG. 8 is a perspective view of another form of the housing mounting system having a single mounting arm and a single fastener aperture provided at diagonal corners from each other.

Referring to FIG. 8, the housing 12' is provided with shoulder 60a from which the flange portion 48 and the arm 24 are formed at diagonally opposite corner regions 74 and 76 of the housing 12'. As can be seen in FIG. 8, the corner region 74 includes a grooved channel 78 at the juncture of the walls 58c and 58a with the flange aperture 48a formed through the shoulder 60a at the bottom of the channel 78. The corner region 76 is formed by the juncture of walls 58b and 58d where the arm 24 of the housing 12' is provided. The arm 24 of housing 12' extend partially along the housing lower edge at the bottom of end wall 58b until it passes end wall 58d with the arm 24 extending down from the bottom wall 54 and out from the housing 12' in a direction substantially perpendicular to the lower edge thereof at the bottom of end wall 58d and to one side of the housing window 60 so that the finger projection 38 extends laterally out from and substantially parallel to the end wall 58d.

Figure 9:
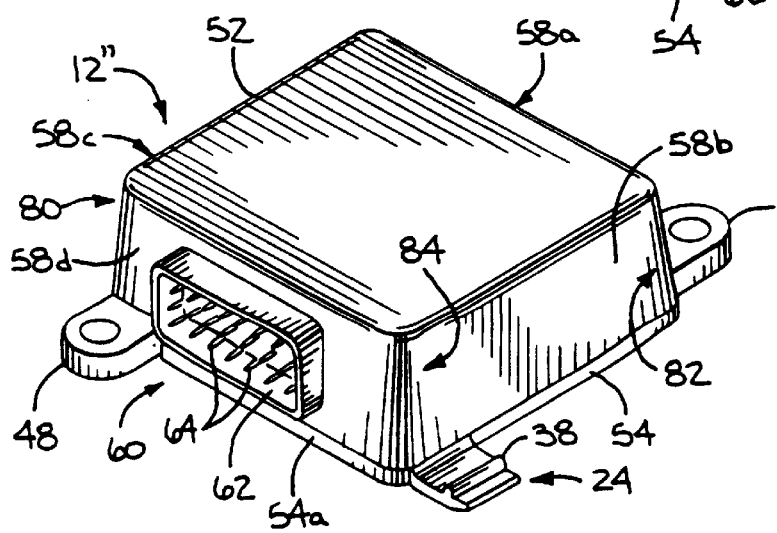
FIG. 9 another form of the present housing system having a pair of fastener-receiving flanges at diagonal corners of the housing and a single mounting arm at another corner of the housing.

FIG. 9 shows another alternative housing 12" where a single mounting arm 24 is utilized with a pair of mounting flanges 48. In the housing 12" of FIG. 9, the flanges 48 are provided at diagonal, non-adjacent corner regions 80 and 82 formed by the juncture of walls 58c and 58d and walls 58a and 58b, respectively. The mounting arm 24 is formed at corner region 84 formed by the juncture of walls 58b and 58d adjacent the two diagonal corner regions 80 and 82. The arm 24 extends substantially down and perpendicularly outward from the lower edge of the housing 12" at the bottom of wall 58b so that the projection 38 extends laterally out from and substantially parallel to end wall 58b. The flanges 48 extend oppositely to each other and substantially perpendicular to and level with the lower edge of housing 12" at the bottom of the walls 58a and 58d. Manifestly, other forms of the present mounting system 11 for the housing 12 herein having different numbers and locations of the mounting arm(s) 24 and flange(s) 48 can be provided to meet specific manufacturing and performance criteria without departing from the invention herein.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

The embodiments of the invention in which an exclusive property or privilege is claimed are defined as follows:

1. A housing mounted on a top surface of a slotted metal frame, the housing comprising:

a rigid base plate in contact with the top surface of said frame;

a first rigid mounting arm fixed with respect to said base plate, and extending from said base plate, such first mounting arm having:

a proximate portion extending in a direction substantially perpendicular to said base plate for insertion through a first slot in the frame with a pivotal insertion of the first mounting arm through the first slot;

an intermediate portion extending in a direction substantially parallel to said base plate and disposed adjacent a bottom surface of the frame opposite said top surface when the first mounting arm is pivoted to bring said base plate into contact with said top surface; and a distal portion projecting from the intermediate portion into a second slot in the frame; and a second rigid mounting arm fixed with respect to said first mounting arm and said base plate, said second mounting arm extending from said base plate opposite said first mounting arm, in contact with the top surface of said frame and adapted to be bolted to said frame.

2. The housing of claim 1 wherein the base plate and first and second mounting arms are formed of a substantially non-creep material.

3. The housing of claim 1 wherein the base plate and the first and second mounting arms thereof are die-cast aluminum.

4. The housing of claim 1 wherein said first mounting arm is integral with said base plate.

5. The housing of claim 1 wherein the distal portion includes a cam surface which cams against the second slot of said frame as the distal portion is projected into the second slot.

6. The housing of claim 1 including a side wall attached to said base plate wherein the first mounting arm is integral with said side wall.

7. The housing of claim 1 wherein a distance between the proximate portion and the distal portion relative to a distance between the first and second slots is such that with the proximate portion in the first slot and the distal portion in the second slot the mounting arm is biased against the frame in the slots thereof so as to be fixed against movement relative to the frame.

8. A low insertion force method for mounting a housing for a control device to a slotted frame, the method the step of comprising:

providing a first mounting arm on the housing extending outwardly therefrom and having first and second frame engaging portions;

inserting the first mounting arm through a first slot in the frame;

positioning the second frame engaging portion to be inserted in a second slot in the frame spaced from the first slot with the first frame engaging portion in the first slot;

pivoting the housing towards the frame until the housing is flush against the frame and the second portion is inserted in the second slot;

providing a second mounting arm on the housing extending outwardly therefrom opposite said first mounting arm; and fastening said second mounting arm to said frame.

* * * * *